US010332026B2

(12) United States Patent
Ettl et al.

(10) Patent No.: US 10,332,026 B2
(45) Date of Patent: Jun. 25, 2019

(54) BUILDING THERMAL CONTROL TECHNIQUES

(71) Applicant: International Business Machines Corporation, Armonk, NY (US)

(72) Inventors: Markus R. Ettl, Ossining, NY (US); Young M. Lee, Old Westbury, NY (US); Hongxia Yang, Pleasantville, NY (US); Rui Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 711 days.

(21) Appl. No.: 14/698,829

(22) Filed: Apr. 28, 2015

(65) Prior Publication Data

US 2016/0146491 A1 May 26, 2016

Related U.S. Application Data

(60) Provisional application No. 62/084,802, filed on Nov. 26, 2014.

(51) Int. Cl.
| | | |
|---|---|---|
| F24F 11/30 | (2018.01) |
| F24F 11/62 | (2018.01) |
| G05B 13/04 | (2006.01) |
| G05B 15/02 | (2006.01) |
| G06F 17/50 | (2006.01) |
| G06N 20/00 | (2019.01) |

(52) U.S. Cl.
CPC ............ *G06N 20/00* (2019.01); *F24F 11/30* (2018.01); *F24F 11/62* (2018.01); *G05B 13/04* (2013.01); *G05B 15/02* (2013.01); *G06F 17/5009* (2013.01); *G05B 2219/2642* (2013.01)

(58) Field of Classification Search
None
See application file for complete search history.

(56) References Cited

U.S. PATENT DOCUMENTS

| | | | |
|---|---|---|---|
| 8,620,632 B2 | 12/2013 | An et al. | |
| 8,781,989 B2 | 7/2014 | Duchon | |
| 2004/0102937 A1* | 5/2004 | Ibrahim | ............... G05B 13/048 703/2 |
| 2011/0231320 A1* | 9/2011 | Irving | .................... G06Q 30/00 705/80 |
| 2012/0316687 A1 | 12/2012 | Chen et al. | |

(Continued)

OTHER PUBLICATIONS

Lee et al., "Modeling and simulation of building energy performance for portfolios of public buildings," in Simulation Conference (WSC), Proceedings of the 2011 Winter, pp. 915-927, Dec. 11-14, 2011.*

(Continued)

*Primary Examiner* — Shaun M Campbell
(74) *Attorney, Agent, or Firm* — Daniel P. Morris; Otterstedt, Ellenbogen & Kammer, LLP

(57) ABSTRACT

An algebra and differential equations model of a physical system is constructed based on available training data and physical system characteristics. A hybrid calibration process is carried out to iteratively calibrate both time-insensitive and time-sensitive parameters of the algebra and differential equations model so as to obtain parameter vectors. Vector auto-regression is applied to the parameter vectors to predict values of the parameters for a future time period.

3 Claims, 15 Drawing Sheets

(56) References Cited

U.S. PATENT DOCUMENTS

| | | |
|---|---|---|
| 2012/0330465 A1 | 12/2012 | O'Neill et al. |
| 2013/0035794 A1 | 2/2013 | Imani |
| 2013/0178993 A1 | 7/2013 | Rombouts et al. |
| 2015/0006125 A1 | 1/2015 | An et al. |
| 2015/0006129 A1 | 1/2015 | An et al. |

OTHER PUBLICATIONS

Wetter et al.; Ttl: Modeling of heat transfer in rooms in the modelica "buildings" library; Publication Ttl: Proceedings of Building Simulation 2011: 12th Conference of International Building Performance Simulation Association; 2011; Publisher: International Building Performance Simulation Association; Country of Publication: USA; ISBN: N/A; Database: Ei Compendex (R).

An et al.; Ttl: An Inverse PDE-ODE model for studying building energy demand; Publication Ttl: 2013 Winter Simulations Conference (WSC); 2013; Publisher: IEEE; Country of Publication: USA; ISBN: 9781479920778; Database: INSPEC.

Park, H., Ruellan, M., Bouvet, A., Monmasson, E., and Bennacer, R., Thermal Parameter Identification of Simplified Building Model with Electric Appliance, IEEE Conference, 2011.

Zheng O'Neill, Satish Narayanan, and Rohini Brahme, Model-based thermal load estimation in buildings, UTRC, IBPSA, 2010.

Shengwei Wang, Xinhua Xu, Hybrid model for building performance diagnosis and optimal control, proceedings of the 3rd international conference for enhanced building operations, 2003.

Peter Armstrong, Steven Leeb, and Leslie Norford, Control with building mass-part1:Thermal Response model, ASHRAE Winter Meeting, 2006.

Model predictive control, downloaded from http://en.wikipedia.org/wiki/Model_predictive_control on Apr. 12, 2015.

BACnet, downloaded from http://en.wikipedia.org/wiki/BACnet on Apr. 23, 2015.

BACnet website, downloaded from http://www.bacnet.org/ on Apr. 23, 2015.

Building automation,downloaded from http://en.wikipedia.org/wiki/Building_automation on Nov. 24, 2014.

Building management system,downloaded from http://en.wikipedia.org/wiki/Building_management_system on Nov. 24, 2014.

Genetic algorithm, downloaded from http://en.wikipedia.org/wiki/Genetic_algorithm on Nov. 25, 2014.

Markus R. Ettl et al., unpublished U.S. Appl. No. 14/985,499 Dec. 31, 2015 Building Thermal Control Techniques pp. 1-26 plus 15 sheets drawings.

List of IBM Patents or Patent Applications Treated as Related.

* cited by examiner $$\lambda_1 \cdot \rho_{wall} \cdot C_{wall} \cdot d_{wall} \cdot \frac{dT_{wo}}{dt} = \lambda_2 \cdot h_{ext}(V_{wind}) \cdot (T_{amb} - T_{wo})$$
$$+ \lambda_3 \cdot K_{wall} \cdot (T_{wi} - T_{wo})$$
$$+ \lambda_4 \cdot Q_{sol} \quad (1)$$

FIG. 4A $$\lambda_5 \cdot \rho_{wall} \cdot C_{wall} \cdot d_{wall} \cdot \frac{dT_{wi}}{dt} = \lambda_3 \cdot K_{wall} \cdot (T_{wo} - T_{wi})$$
$$+ \lambda_6 \cdot h_{int} \cdot (T_z - T_{wi}) \quad (2)$$

FIG. 4B $$\lambda_7 \cdot \rho_{air} \cdot C_{air} \cdot V_z \cdot \frac{dT_z}{dt} = \lambda_8 \cdot A_{wall} \cdot h_{int} \cdot (T_{wi} - T_z)$$
$$+ \lambda_9 \cdot A_{win} \cdot Q_{sol}$$
$$+ Q_{load} + Q_{sys} \quad (3)$$

FIG. 4C

| | |
|---|---|
| $\lambda_i$ (i = 1 ... 9) | are the stochastic multipliers (dynamic nature of the heat transfer process in building) |
| $T_z$ | is the room temperature, which is the variable for which it is attempted to minimize misfit with measurement |
| $T_{amb}$ | is the measured outside air temperature |
| $T_{wo}$ | is the computed outside wall temperature |
| $T_{wi}$ | is the computed inside wall temperature |
| $h_{ext}(V_{wind})$ | is the time variant exterior heat transfer coefficient (e.g., $h_{ext}(V_{wind}) = 10.97 + 4.192 \cdot V_{wind}$) |
| $\rho_{wall/air}$ | is the density of the wall/air |
| $C_{wall/air}$ | is the specific heat of the wall/air |
| $d_{wall}$ | is the thickness of the wall |
| $K_{wall}$ | is the conductivity of the wall material |
| $h_{int}$ | is the interior heat transfer coefficient |
| $A_{wall/window}$ | is the surface area of the wall/windows |
| $Q_{sol}$ | is the solar energy incidence on the building envelope |
| $Q_{load}$ | is the time variant internal load |
| $Q_{sys}$ | is the system input from heat and cooling equipment |

FIG. 4D $$Q_{load}^{0000-0700} = \beta_{10}$$

$$Q_{load}^{0070-0900} = \beta_{11}$$

$$Q_{load}^{0090-1100} = \beta_{12}$$

$$Q_{load}^{1100-1300} = \beta_{13}$$

$$Q_{load}^{1300-1500} = \beta_{14}$$

$$Q_{load}^{1500-1700} = \beta_{15}$$

$$Q_{load}^{1700-1900} = \beta_{16}$$

$$Q_{load}^{1900-2400} = \beta_{17}$$

FIG. 4E $$\underset{\overline{\lambda},\overline{\beta}}{\text{minimize}}\ J(\overline{\lambda},\overline{\beta}) = \sum_{t=1}^{n} (T_{z,t} - \hat{T}_{z,t}(\overline{\lambda},\overline{\beta}))^2 \qquad (4)$$

subject to Physical Model $T_{z,0} = T_{z,\text{end of previous day}}$,
$T_{wo,0} = 0.1 \times T_{z,0} + 0.9 \times T_{amb,0}$,
$T_{wi,0} = 0.3 \times T_{z,0} + 0.7 \times T_{amb,0}$.

FIG. 5

A multivariate $p$-dimensional process $y_t$ follows a vector autoregressive model of order $l$, denoted as $\text{VAR}_p(l)$, if $y_t$ can be written in terms of its $l$ most recent past values. This is $$y_t = \Psi_1 y_{t-1} + \Psi_2 y_{t-2} + \cdots + \Psi_l y_{t-l} + e_t, \quad (5)$$

- $\Psi_j$s are $p \times p$ matrices of VAR coefficients for $j = 1:l$.
- $e_t$ is a $p$-dimensional zero-mean vector with variance-covariance $r_t \Sigma$, where $r_t$ is the residual of the parameter estimation for time $t$.

*FIG. 10*

|     | V1       | V2       | V3       | V4       | V5       | V6       | V7       | V8       |
|-----|----------|----------|----------|----------|----------|----------|----------|----------|
| V1  | 7.665634 | 2.551134 | 4.447763 | -0.6424  | 1.14054  | -3.32606 | 3.317042 | -0.57079 |
| V2  | 2.551134 | 2.714795 | 1.646459 | -0.62339 | 0.556802 | 0.903331 | -0.1388  | -0.22624 |
| V3  | 4.447763 | 1.646459 | 9.850931 | 0.130132 | 2.02505  | -3.46532 | -0.28952 | -0.013   |
| V4  | -0.6424  | -0.62339 | 0.130132 | 2.772494 | -0.38664 | -0.60249 | -0.71794 | 0.038669 |
| V5  | 1.14054  | 0.556802 | 2.02505  | -0.38664 | 4.107754 | -0.2796  | -0.28606 | -0.24375 |
| V6  | -3.32606 | 0.903331 | -3.46532 | -0.60249 | -0.2796  | 8.707202 | -5.31057 | 0.105376 |
| V7  | 3.317042 | -0.1388  | -0.28952 | -0.71794 | -0.28606 | -5.31057 | 8.903046 | -0.76958 |
| V8  | -0.57079 | -0.22624 | -0.013   | 0.038669 | -0.24375 | 0.105376 | -0.76958 | 0.211579 |
| V9  | 0.131114 | 0.031836 | 1.783182 | 0.87275  | 0.132096 | 0.06319  | -0.38177 | -0.04911 |
| V10 | 3.575801 | -0.79349 | 6.689127 | 1.256536 | -2.67808 | -9.2819  | 6.328574 | 0.057214 |
| V11 | 1.505314 | 1.302448 | -0.85148 | 2.569762 | -0.49103 | 1.327615 | 0.722933 | -0.27885 |
| V12 | -5.07343 | 1.094755 | -0.75659 | -2.81349 | 2.117244 | 9.392233 | -9.41983 | 0.484545 |
| V13 | -6.0983  | -0.87874 | -6.48601 | -2.61295 | 0.050484 | 6.521758 | -3.68561 | -0.14477 |
| V14 | 0.288035 | -1.92049 | 0.425005 | -0.47504 | -0.24786 | -2.69973 | 1.21028  | 0.263185 |
| V15 | 1.529405 | 2.030594 | -1.3706  | -1.20925 | 0.903446 | 2.663413 | -0.85485 | -0.26439 |
| V16 | 1.026567 | 0.436641 | 4.748808 | -1.26012 | 1.886809 | 0.824093 | -4.80621 | 0.436334 |
| V17 | 0.702841 | 0.122737 | 0.148167 | -0.52188 | -0.24851 | -0.66796 | -0.31032 | -0.12128 |

*FIG. 12A*

|     | V9       | V10      | V11      | V12      | V13      | V14      | V15      | V16      | V17      |
| --- | -------- | -------- | -------- | -------- | -------- | -------- | -------- | -------- | -------- |
| V1  | 0.131114 | 3.575801 | 1.505314 | -5.07343 | -6.0983  | 0.288035 | 1.529405 | 1.026567 | 0.702841 |
| V2  | 0.031836 | -0.79349 | 1.302448 | 1.094755 | -0.87874 | -1.92049 | 2.030594 | 0.436641 | 0.122737 |
| V3  | 1.783182 | 6.689127 | -0.85148 | -0.75659 | -6.48601 | 0.425005 | -1.3706  | 4.748808 | 0.148167 |
| V4  | 0.87275  | 1.256536 | 2.569762 | -2.81349 | -2.61295 | -0.47504 | -1.20925 | -1.26012 | -0.52188 |
| V5  | 0.132096 | -2.67808 | -0.49103 | 2.117244 | 0.050484 | -0.24786 | 0.903446 | 1.886809 | -0.24851 |
| V6  | 0.06319  | -9.2819  | 1.327615 | 9.392233 | 6.521758 | -2.69973 | 2.663413 | 0.824093 | -0.66796 |
| V7  | -0.38177 | 6.328574 | 0.722933 | -9.41983 | -3.68561 | 1.21028  | -0.85485 | -4.80621 | -0.31032 |
| V8  | -0.04911 | 0.057214 | -0.27885 | 0.484545 | -0.14477 | 0.263185 | -0.26439 | 0.436334 | -0.12128 |
| V9  | 1.241713 | 2.394406 | 1.131583 | -1.57324 | -1.08063 | -0.06808 | -0.83967 | 0.069572 | 0.14486  |
| V10 | 2.394406 | 26.08759 | 1.873774 | -17.3762 | -12.8383 | 3.070859 | -6.08922 | -1.19639 | -2.39416 |
| V11 | 1.131583 | 1.873774 | 10.97152 | -5.55347 | -2.63905 | -1.48882 | -0.49191 | -5.73962 | -1.96412 |
| V12 | -1.57324 | -17.3762 | -5.55347 | 27.11165 | 12.20286 | -3.80732 | 3.335676 | 6.302016 | 0.954532 |
| V13 | -1.08063 | -12.8383 | -2.63905 | 12.20286 | 18.30436 | -0.42971 | 1.45505  | -0.88348 | 5.112571 |
| V14 | -0.06808 | 3.070859 | -1.48882 | -3.80732 | -0.42971 | 4.378239 | -2.4135  | -0.27157 | 1.544014 |
| V15 | -0.83967 | -6.08922 | -0.49191 | 3.335676 | 1.45505  | -2.4135  | 6.221988 | 1.262734 | -1.85415 |
| V16 | 0.069572 | -1.19639 | -5.73962 | 6.302016 | -0.88348 | -0.27157 | 1.262734 | 13.24153 | 1.835006 |
| V17 | 0.14486  | -2.39416 | -1.96412 | 0.954532 | 5.112571 | 1.544014 | -1.85415 | 1.835006 | 11.04895 |

*FIG. 12B*

BUILDING THERMAL CONTROL TECHNIQUES

CROSS-REFERENCE TO RELATED APPLICATIONS

This application claims the benefit of U.S. Provisional Patent Application No. 62/084,802, filed on Nov. 26, 2014, the complete disclosure of which is expressly incorporated by reference herein in its entirety for all purposes.

FIELD OF THE INVENTION

The present invention relates to the thermodynamic arts, and, more particularly, to thermal control techniques for structures, and the like.

BACKGROUND OF THE INVENTION

A building automation system is a computer-based control system installed in buildings that controls and monitors the building's mechanical and electrical equipment such as heating, ventilating, and air conditioning (HVAC) systems.

SUMMARY OF THE INVENTION

Principles of the invention provide techniques for building thermal control and similar applications. In one aspect, an exemplary method includes the steps of constructing an algebra and differential equations model of a physical system based on available training data and physical system characteristics; carrying out a hybrid calibration process to iteratively calibrate both time-insensitive and time-sensitive parameters of the algebra and differential equations model so as to obtain parameter vectors; and applying vector auto-regression to the parameter vectors to predict values of the parameters for a future time period.

As used herein, "facilitating" an action includes performing the action, making the action easier, helping to carry out the action, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects; for example, accurate prediction of energy consumption of HVAC systems and more effective model predictive control (MPC) of HVAC systems.

These and other features and advantages of the present invention will become apparent from the following detailed description of illustrative embodiments thereof, which is to be read in connection with the accompanying drawings.

BRIEF DESCRIPTION OF THE DRAWINGS

FIGS. 4A-4E show a physical model, according to an aspect of the invention;

FIG. 5 shows least squares formulation for parameter fitting, according to an aspect of the invention;

FIG. 10 shows vector auto-regression for time sensitive dynamic parameters, according to an aspect of the invention;

FIGS. 12A and 12B show a table of correlation heat map data for parameters, according to an aspect of the invention.

DETAILED DESCRIPTION OF PREFERRED EMBODIMENTS

Figure 1A:
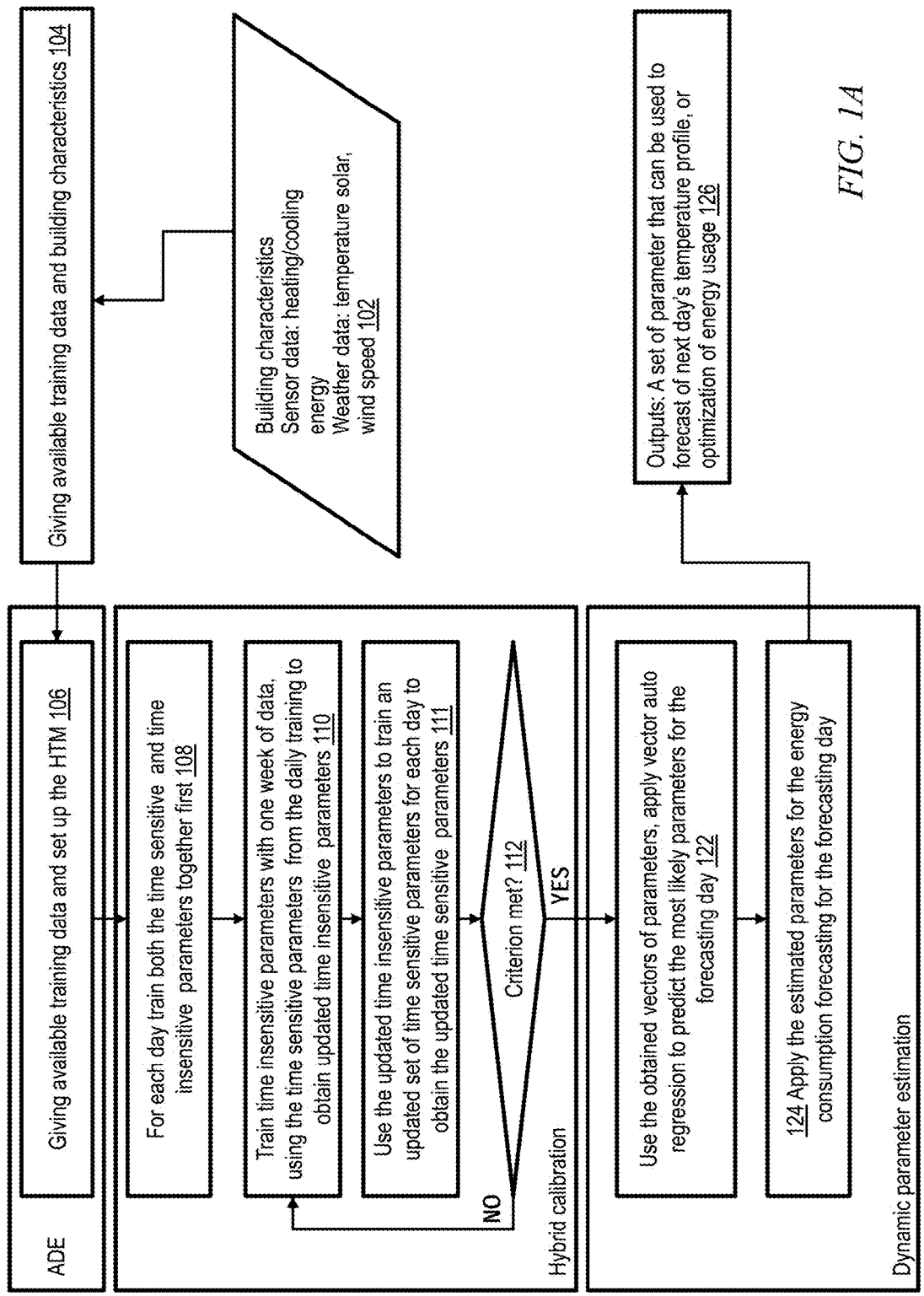
FIGS. 1A and 1B show a flow chart of an exemplary method, according to an aspect of the invention.

As noted, a building automation system is a computer-based control system installed in buildings that controls and monitors the building's mechanical and electrical equipment such as heating, ventilating, and air conditioning (HVAC) systems. Some embodiments advantageously provide an inverse modeling procedure for a heat transfer model with stochastic and temporal parameter modeling for forecasting. One or more embodiments are broadly applicable to the modeling of physical systems that are described by physical models (e.g., ordinary differential equations (ODE), partial differential equations (PDE), algebra and differential equations (ADE), and the like) while also combining statistical methodology to evaluate time sensitive parameters in order to improve prediction accuracy. One or more embodiments are particularly suitable for building thermal control; however, this is a non-limiting exemplary application.

One or more embodiments advantageously improve the heat transfer model (HTM) for forecasting purposes, using the system of algebra and differential equations (ADE) with stochastic and temporal modelling for parameter forecasting. The improved forecasting model may be implemented in optimization models for energy consumption, as well as energy forecasting models. Current techniques do not differentiate time sensitive and time insensitive parameters, and do not accurately model the stochastic and temporal nature of the time sensitive parameters. Thus, it is challenging to accurately estimate physical parameters of a system of ADEs to describe the physical processes; to develop a hybrid calibration procedure for estimating both time insensitive and time sensitive parameters to avoid over-fitting while correctly modelling the dynamics of the system; and to obtain an accurate framework for modeling the temporal covariance structure of the time sensitive parameters.

One or more embodiments provide a procedure for estimating stochastic and temporal parameters of physical models using dynamic sensor data for forecasting the next time horizon, advantageously combining principles of physical modeling and statistics—batch training vs. online training One or more embodiments employ a system of ADEs to model the physical process, using a system of ADEs to model the energy flow process, and using device time sensitive and time insensitive parameters to capture the different level of temporal dynamics of the physical model (addresses challenge of accurately estimating physical parameters).

Furthermore, one or more embodiments utilize hybrid iterative calibration procedures to fit the time insensitive and time sensitive dynamic of the physical model. In this regard, iterative parameter calibration is employed in one or more embodiments to calibrate the time insensitive parameters and time sensitive parameters; time insensitive parameters are employed for relatively steady characteristics, which change relatively slower than time sensitive parameters, i.e., building physical characteristics; and time sensitive parameters are employed for more dynamic changes, i.e. internal load of the building (addresses challenge of developing a hybrid calibration procedure for estimating both time insensitive and time sensitive parameters to avoid over-fitting while correctly modelling the dynamics of the system).

Even further, one or more embodiments provide a parameter estimation procedure using a vector auto-regression method. The historical trend of time sensitive parameters fitted from each day demonstrates the dynamic nature; and the vector auto-regression method with ADE fitting residual based covariance structure is used to correctly model the dynamics in fitted time sensitive parameters in the system of equations (addresses challenge of obtaining an accurate framework for modeling the temporal covariance structure of the time sensitive parameters).

One or more embodiments employ a dynamic technique with hybrid calibration, taking into account the stochastic nature of the problem. In particular, current techniques assume constant parameters, which do not change over time. Due to the dynamic change of weather and operational conditions, the parameters tend to change significantly, thus one or more embodiments advantageously model the dynamics of the parameters.

Figure 1B:
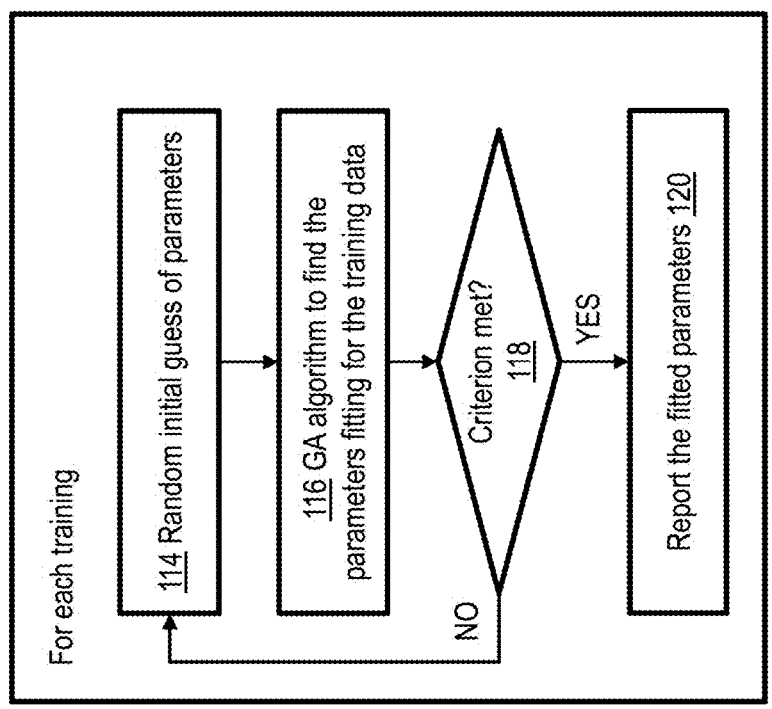

FIGS. 1A and 1B show an exemplary process flow chart. As indicated at step 104, the process begins with available training data and building characteristics as givens. Examples of such input data are shown at 102: building characteristics; sensor data such as heating and/or cooling energy; and weather data such as temperature, solar flux, and wind speed. In step 106, given the available training data, set up the heat transfer model (HTM)—for example, in the form of a system of ADEs. Now, consider—given a current set of $\lambda$ values and $\beta$ values (see FIGS. 4A-4E, and 5), how to change the model? Refer to the hybrid calibration section of FIG. 1A. For each day, train both the time sensitive and time insensitive parameters together first in step 108. In step 110, train time insensitive parameters with one week of data, using the time sensitive parameters from the daily training to obtain updated time insensitive parameters. In step 111, use the updated time insensitive parameters to train an updated set of time sensitive parameters for each day to obtain the updated time sensitive parameters. As indicated by decision block 112, this is an iterative process, continued until convergence is achieved.

Each training step 108, 110, 111 can be carried out as shown in steps 114-120 in FIG. 1B (thus, FIG. 1B shows part of the hybrid calibration process). In particular, for each training step, as shown in step 114, make an initial estimate of the parameters. Then, in step 116, use the GA algorithm to find the parameter fitting for the given time period (e.g., day). As per decision block 118, iterate until the applicable criterion is met, then report the fitted parameters in step 120.

The skilled artisan will appreciate that, in the field of artificial intelligence, a genetic algorithm (GA) is a search heuristic that mimics the process of natural selection.

In step 122, using the vectors of parameters obtained via hybrid calibration, apply vector auto-regression (see FIG. 10) to predict the most likely parameters for the forecasting day. In step 124, apply the estimated parameters for the energy consumption forecasting for the forecasting day. As seen at 126, the result is a set of parameters which constitute a model that will allow forecasting what will happen thermally the next day so that the operation of the heating or cooling system can be optimized. Steps 122 and 124 correspond to dynamic parameter estimation.

Figures 2, 3:
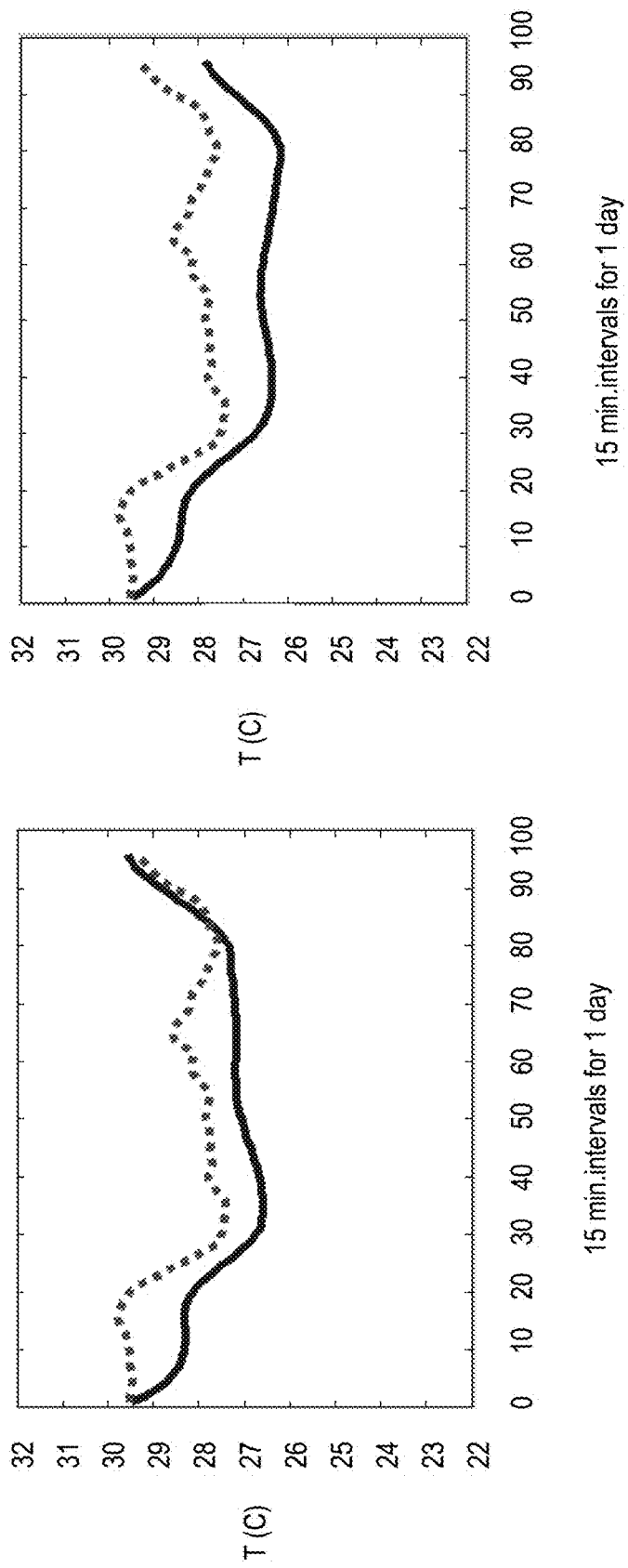
FIG. 2 shows exemplary output from an embodiment of the invention.
FIG. 3 shows exemplary output from a prior art technique.

FIG. 2 shows exemplary output from an embodiment of the invention; in particular, the measured actual temperature (dotted line) and the fitted (predicted) temperature (solid line). This convention for dotted and solid lines is used in all the figures. T (C) refers to temperature in degrees Centigrade (Celsius). For comparison purposes, FIG. 3 shows exemplary output from a prior art technique; in particular, the measured actual temperature (dotted line) and the fitted (predicted) temperature (solid line). It can be seen that the match is better for the example of FIG. 2 than for the prior art technique of FIG. 3. Indeed, in the example, the CVRMSE (coefficient of variation of the root-mean-square deviation) improves from about 0.047 to about 0.031.

The skilled artisan will appreciate that SI units are used throughout.

FIGS. 4A-4E present a system of ADEs to model the heat transfer process in buildings. The physical model is given by equations (1), (2), and (3) in FIGS. 4A, 4B, and 4C respectively, with the parameters as defined in FIGS. 4D and 4E. In one or more embodiments, time-insensitive parameters are thermal parameters such as heat transfer coefficient, thermal conductivity, and solar-related parameters. (While the thermal and solar parameters do change, the change is not as dynamic as in the case of the time-sensitive parameters). The time-sensitive parameters include user-related parameters; e.g., user opens or closes a window, turns lights on or off, and the like. The user-related parameters are treated as time-sensitive parameters in one or more embodiments. The temporal patterns can be captured using a time series model. The $\lambda_i$ values are not actual heat transfer coefficients; they are a kind of multiplier that are estimated based on weather/climatic conditions and the material of the building. In actuality, a range of values for the lambda parameters can be estimated. The lambda values change based on actual weather conditions.

Consider, in contrast, the $Q_{load}$ values in FIG. 4E. These are time-sensitive values; thermodynamic parameters that change over the course of the day. The thermal load at different times during the day is given by the parameters $\beta_{10}$ through $\beta_{17}$. From 0000 to 0700 (using 24 hour time) there is little change; the values are discretized in two hour chunks during the business day; from 1900 hours to 2400 hours, there is little change. The usage patterns in commercial buildings can be captured using auto regression/time series modeling. Different numbers of people in a given space throughout the day generate different levels of heat. Furthermore, people's activities change throughout the day (e.g., how intensely are they using computing resources); this will also change the level of heat generated.

FIG. 5 shows least square formulation for parameter fitting. J, given by equation (4), is minimized subject to the indicated constraints. The multipliers of physical parameters are estimated through minimizing the difference between simulated and measured zone temperature profiles. Multipliers include, for example, heat conduction and convection of wall (same for different side of wall); solar impact on different side of wall that accounts for different shading effect from neighboring buildings; solar impact through windows; and dynamic internal load. Thus, regarding training of the model, as seen in FIG. 5, use least squares to minimize the difference between calculated and measured values. Solve for a set of $\lambda$ values that minimizes the square of the error.

Figure 6:
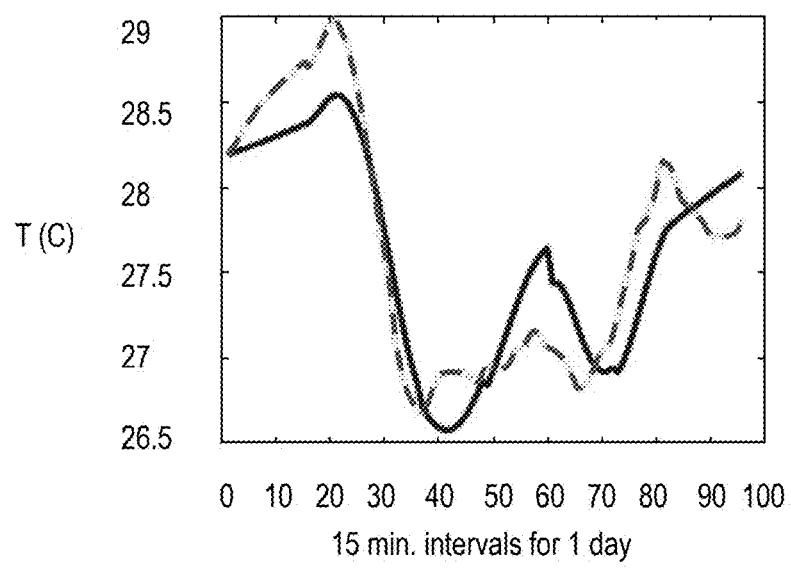
FIGS. 6, 7, and 8 show experimental results for fitted versus measured temperatures for three different exemplary days, according to an aspect of the invention.
Figure 7:
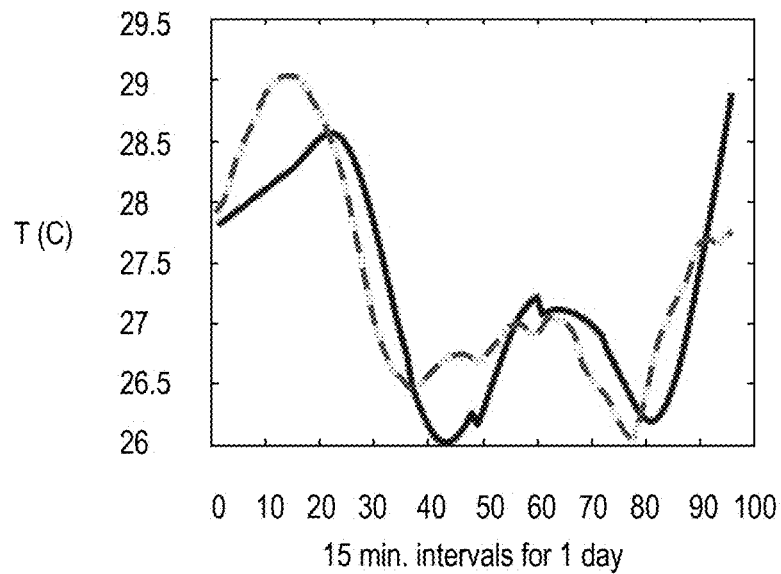
Figure 8:
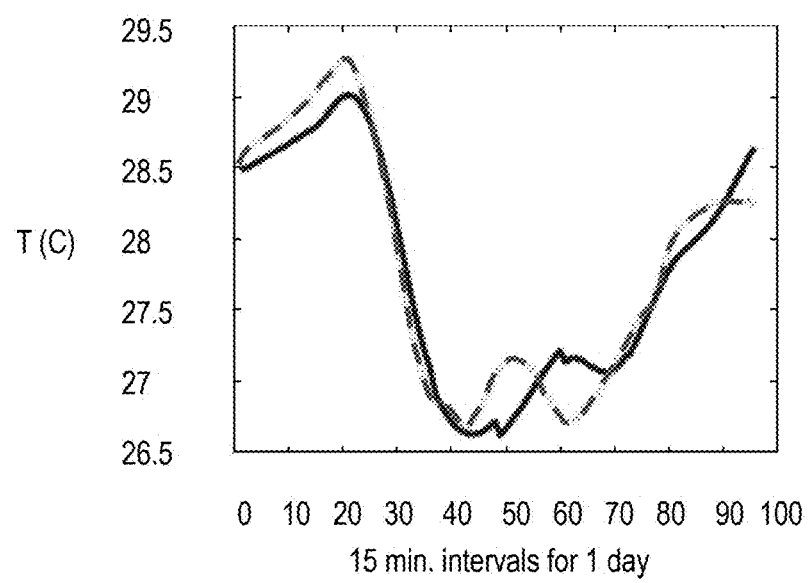
Figure 9:
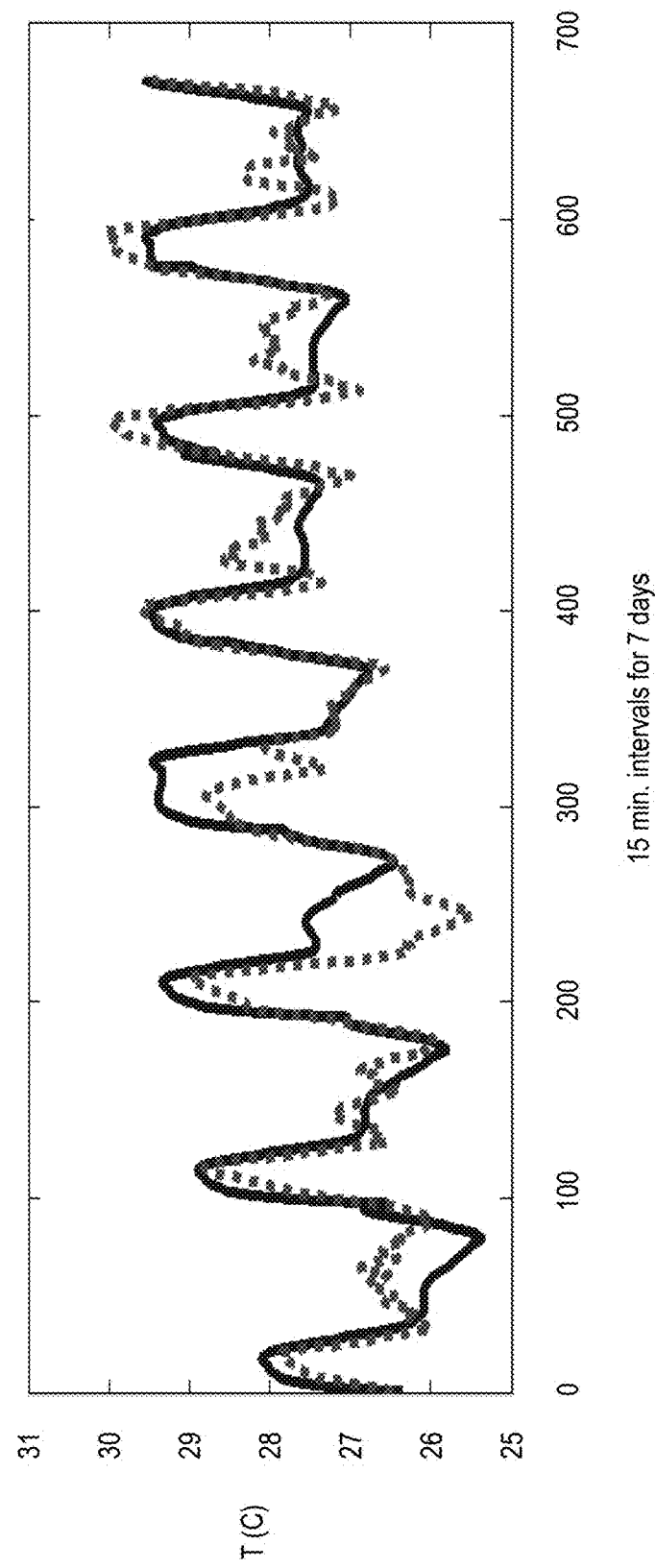
FIG. 9 shows experimental results for fitted versus measured temperature for an exemplary week, after iterative calibration, according to an aspect of the invention.

FIGS. 6, 7, and 8 show heat transfer model experimental results for fitted versus measured temperatures for three different exemplary days. In each case, the fitted temperature is the solid line while the dotted line is the measured temperature. FIG. 9 shows heat transfer model experimental results for fitted (solid line) versus measured (dotted line) temperature for an exemplary week, after iterative calibration.

FIG. 10 shows vector auto-regression for time sensitive dynamic parameters (e.g., betas). The values of the multivariate p-dimensional process $y_t$ at time t are given by equation (5). There are a set of $\beta$ values representing the load at given times of the day for each day during the week. There is a correlation between the load at 7 AM and the load at 9 AM; they correlate or interact to some extent. The vector autoregressive model takes into account this correlation between loads at different times of the day.

Figure 11:
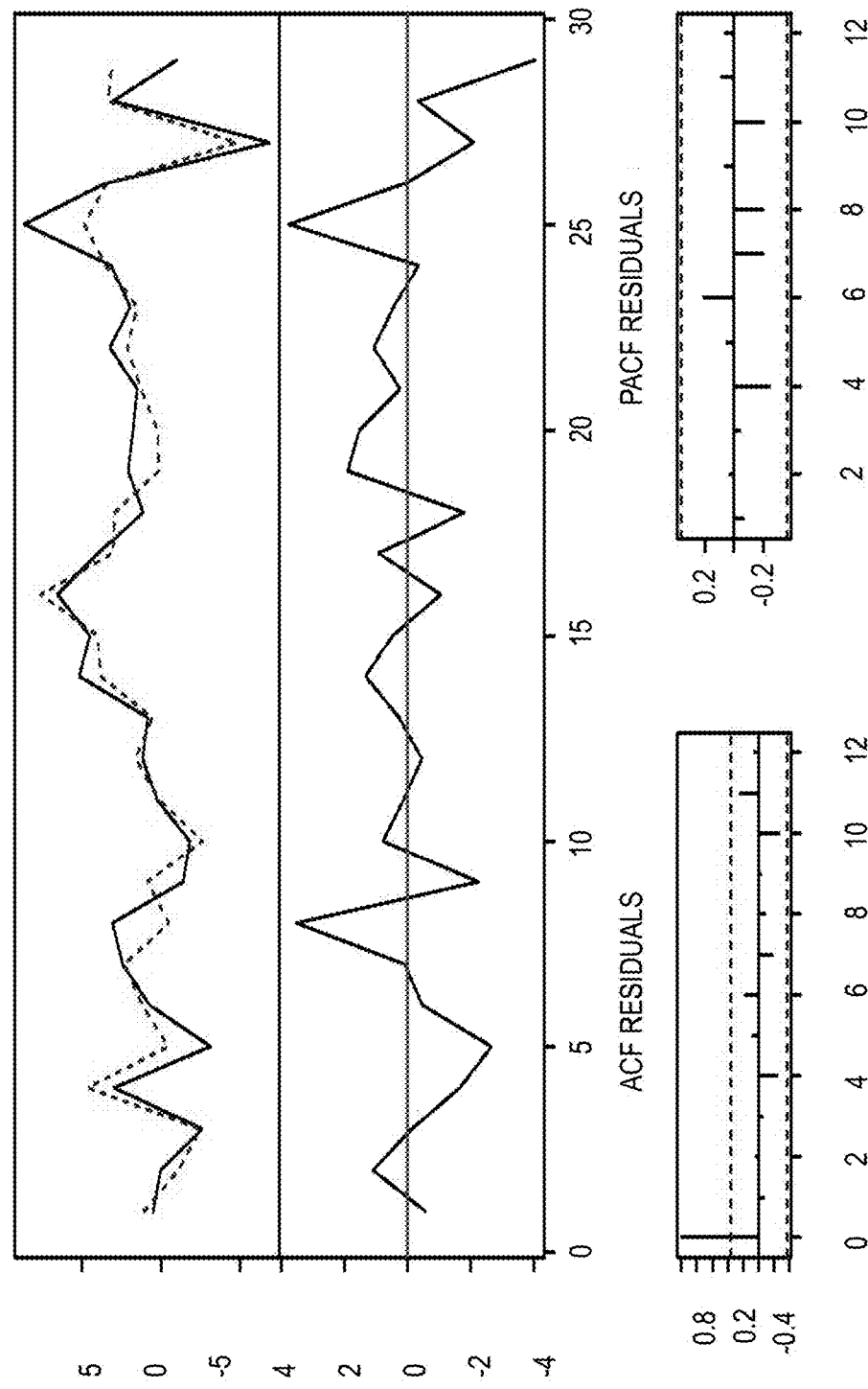
FIG. 11 shows parameter estimation and fitting diagnostics, according to an aspect of the invention.

FIG. 11 shows parameter estimation and fitting diagnostics for V1 (e.g. $\beta_1$). Note the auto correlation function (ACF) residuals and the partial auto correlation function (PACF) residuals. ACF and PACF are statistical tests for the model sufficiency of the dynamic data.

FIGS. 12A and 12B show a table of correlation heat map data for parameters. In particular, FIGS. 12A and 12B show levels of correlation between two parameters (e.g., V1 with each of V1-V17, V2 with each of V1-V17, and so on) (V1-V17=$\beta_1$ to $\beta_{17}$).

Statistical modeling in accordance with one or more embodiments of the invention is advantageously combined with physical modelling. One or more embodiments dynamically update physical models instead of using batch learning, include uncertainty from studying physical models to statistical models, provide adaptive feedback from statistical model outputs to help improve the estimation of physical models, and/or employ variable selection that is an automatic product from statistical output (e.g., helping customers to save resources).

One or more embodiments advantageously improve Heat Transfer Model (HTM) forecasting, using a system of Algebra and Differential Equations (ADEs) with hybrid calibration and stochastic and temporal modeling of parameters prediction for the next forecast time horizon. One or more embodiments provide a method for hybrid calibration and for applying vector auto-regression with a fitting residual-based covariance structure method to address the challenges of accurate estimation of physical parameters of a system of ADEs to describe a physical process; a hybrid calibration method for estimating both time-insensitive and time-sensitive parameters to avoid over fitting while correctly modelling the dynamics of the system; and an accurate framework for modeling time sensitive parameter dynamics.

One or more embodiments provide a method that uses a system of ADEs to model the physical process, i.e., internal heat sources and heating, cooling and air conditioning systems in a building (addressing the challenge of accurate estimation of physical parameters of a system of ADEs to describe the physical process). One or more embodiments use variable internal loads as time sensitive parameters to model the dynamics of indoor environments of various heat sources and/or sinks, and/or use a hybrid calibration with multiple iterations procedure for estimating the time insensitive and time sensitive parameters (addressing the challenge of providing a hybrid calibration method for estimating both time-insensitive and time-sensitive parameters to avoid over fitting while correctly modelling the dynamics of the system). Further, one or more embodiments use a stochastic temporal model, i.e. vector auto-regression, with a fitting residual-based covariance structure method to correctly model the dynamics in fitted time sensitive parameters in the system of ADEs (addressing the challenge of providing an accurate framework for modeling time sensitive parameter dynamics).

Note that one or more embodiments are not limited to a simplistic heat transfer model in the form of an ODE (ordinary differential equations). Furthermore, one or more embodiments are not limited to a stepwise parameter estimation method that integrates the PDE model, which describes heat transfer through the building envelope of a building, and the ODE, which describes the heat transfer and thermal balance in a space inside the building model in generating the heat transfer model. In these prior techniques, it is assumed that all the parameters are constant (i.e., time invariant). In contrast, one or more embodiments employ hybrid calibration of time sensitive parameters and time insensitive parameters and/or a vector auto-regressive method for estimating the time variant parameters. It should be noted that one or more embodiments employ a hybrid calibration method of time-sensitive parameters and time-insensitive parameters, and a vector autoregressive method for estimating the time variant parameters jointly. Indeed, one or more embodiments use a system of Algebra and Differential Equations (ADEs) with stochastic and temporal modeling for parameter forecasting.

Note that some embodiments are particularly useful in the field of thermal characterization of buildings. Some embodiments improve the energy consumption forecasting for buildings. Some embodiments use a system of ODEs and vector regression on inverse heat transfer model parameter estimation. The improved energy forecasting model may be used by optimization models for energy consumption or cost reduction for buildings. One or more embodiments provide an accurate system of ODEs to model heat transfer and energy consumption process in buildings; correctly model the impact of weather conditions on building energy consumption; and/or accurately model the stochastic nature of the parameters in the heat transfer model. One or more embodiments address the provision of an accurate system of ODEs as a heat transfer model; balance between accuracy and physical sensor installment; and/or an accurate model for parameter dynamics. Again, one or more embodiments are not limited to ODEs but address a system of Algebra and Differential Equations (ADEs).

Some embodiments provide a novel procedure for estimating stochastic parameters of a building heat transfer model using dynamic sensor data for forecasting energy consumption for buildings.

Again, while one or more embodiments are not limited to ODEs but address a system of Algebra and Differential Equations (ADEs), some embodiments address a system of ODEs to model the heat transfer and energy flow in buildings. A system of ODEs is used to model: the energy flow process cross-building-envelope, internal heat sources and heating, and cooling and air conditioning systems in a building. Some embodiments also apply multipliers to certain physical parameters; some embodiments employ a solar model to correctly model the effect of solar heat on building energy consumption; and some embodiments employ Variable Internal loads to model the dynamics of indoor environments of various heat sources and/or sinks (this addresses the challenge of providing an accurate system of ODEs as the heat transfer model).

One or more embodiments employ daily calibration procedures to capture the daily cyclic nature of the heat transfer process in buildings. For example, daily parameter calibration is employed to maintain the dynamic nature of the heat transfer process in buildings and/or a multiple iteration procedure is used to find the best model fitting for each day (this also addresses the challenge of providing an accurate system of ODEs as the heat transfer model). Furthermore, one or more embodiments use a calibration procedure that requires minimum measurement data; namely, indoor air temperature, system thermal energy input and weather information (this addresses the challenge of providing an accurate model for parameter dynamics).

Yet further, one or more embodiments provide a parameter estimation procedure using a vector auto-regression method. The historical trend of parameters is fitted from each day, demonstrating the dynamic nature; also, the vector auto-regression method is used to correctly model the dynamics in fitted parameters in the system of ODEs (this addresses the challenge of providing balance between accuracy and physical sensor installment).

Thus, by way of review, one or more embodiments provide a hybrid calibration method of time sensitive parameters and time insensitive parameters, and a vector auto-regressive method for estimating the time variant parameters jointly for thermal modeling of buildings. Advantageously, unlike the prior art, one or more embodiments are able to differentiate between time-sensitive and time-insensitive parameters; and/or are able to accurately model the stochastic and temporal nature of the time-sensitive parameters. One or more embodiments are partially implemented in computer code running on a computer; the code interfaces with input data system (sensors, meters) and the results of the computation interface with external systems (i.e., a building HVAC controller or fault detection tool). The result of the running of the code on a computer is sent to one or more other devices (e.g., building HVAC controller or BAS (Building Automation System) or FDD (Fault Detection and Diagnosis)) tool so that the building HVAC system operates in a more energy-efficient way. In one or more embodiments, the code obtains input data (sensor and meter data) from the Building Management System (BMS), BAS and weather station, and the output of the code (i.e., thermal model of building with parameter values) is sent to a Model Predictive Controller (MPC; also referred to as a Model Predicted Controller) of one or more buildings or a Model Predictive FDD (Fault Detection and Diagnosis; also referred to as a Model Predicted FDD) tool so that energy efficient control of building HVAC systems and/or accurate fault detection of HVAC systems are performed. See discussion of FIG. 13 below.

One or more embodiments can be used in many different contexts. Consider jurisdictions where, if a certain level of utility usage is exceeded during a certain time of the day, a penalty may be imposed. The model can capture the peak load during the day and allow for changing the set-point temperature during the pertinent time of the day. For example, if looking at cooling load, increase the set-point temperature during the critical period; if looking at heating load, decrease the set-point temperature during the critical period. Typically, a building will have a controller (building automation system) to control building HVAC. It will generate a control profile based on the model predictions for the next 24 hours, e.g. If an accurate model prediction is not available, the controller will likely produce a control profile which is not very cost effective. One or more embodiments produce an accurate model to predict the next 24 hours of energy consumption, in turn allowing the controller to generate a cost-effective control profile. That is to say, building controllers themselves are well-known; one or more embodiments produce a more accurate model for input into the building controller. Even well-constructed controllers are not capable of economically controlling a building in the absence of accurate inputs.

Given the discussion thus far, it will be appreciated that, in general terms, an exemplary method, according to an aspect of the invention, includes the step 106 of constructing an algebra and differential equations model of a physical system based on available training data and physical system characteristics. This step can be carried out, for example, by a human subject matter expert. In some instances, this step is omitted and the model is obtained as a given via a suitable interface.

A further step (e.g., steps 108-120 taken together) includes carrying out a hybrid calibration process to iteratively calibrate both time-insensitive and time-sensitive parameters of the algebra and differential equations model so as to obtain parameter vectors. This step can be carried out, for example, with a hybrid calibration sub-module of modeling module 1399, which implements the algorithm within the "hybrid calibration" box of FIG. 1A and the steps in FIG. 1B.

An even further step 122, 124 includes applying vector auto-regression to the parameter vectors to predict values 126 of the parameters for a future time period. This step can be carried out, for example, with a vector auto-regression sub-module of modeling module 1399, which implements the algorithm within the "dynamic parameter estimation" box of FIG. 1A.

In some instances, in the constructing step, the model of the physical system includes a heat transfer model of a building, and additional steps include supplying a predictive model, based on the predicted values of the parameters for the future time period, to a building heating, ventilating, and air conditioning system model predictive controller 1397; and controlling the building heating, ventilating, and air conditioning system 1393 in accordance with the predictive model. See discussion of FIG. 13 below. Furthermore in this regard, in one aspect, the model predictive controller includes elements which implement the whole described process together; e.g., collecting data, training, and sending control signals. In one or more embodiments, MPC module 1397 sends control signals to one or more specific heating or cooling devices. For example, a signal is sent to a chiller to instruct the chiller to operate at a certain set point. The chiller typically has its own logic for achieving a desired set point. Thus, in one or more embodiments, MPC module 1397 includes software embodied on a non-transitory medium, executing on a computer processor and sending a set point out to the chiller, heater, etc. Control signals can be sent, for example, using the BACnet Data Communication Protocol for Building Automation and Control Networks, developed under the auspices of the American Society of Heating, Refrigerating and Air Conditioning Engineers (ASHRAE). BACnet is an American national standard, a European standard, a national standard in more than 30 countries, and an ISO global standard, incorporated herein by reference in its entirety for all purposes. The protocol is supported and maintained by ASHRAE Standing Standard Project Committee 135. Thus, one or more embodiments include internal communication among and between modules 1395, 1397, 1399, as well as communication with external components to be controlled, via BACnet or the like.

In some instances, in the constructing step, the model of the physical system includes a heat transfer model of a building, and additional steps include supplying a predictive model, based on the predicted values of the parameters for the future time period, to a building heating, ventilating, and air conditioning system model predictive fault detection and diagnosis tool 1395; and troubleshooting the building heating, ventilating, and air conditioning system 1393 in accordance with the predictive model. See discussion of FIG. 13 below. Furthermore in this regard, this aspect may act as an alarm system; for example, via display rather than sending control signals. This aspect may be implemented as a software tool which compares measured values and predicted values. Measured values are measured from sensors, meters, or the like; while predicted values calculated by the models. Suppose a model predicts energy consumption is 10 kW-hr; while the measured value is 5 kW-hr. MPFDD 1395 will flag this deviation. Modeling tool 1399 provides the predicted value. In some instances, rather than troubleshooting the HVAC system, the model may be refined to better reflect measured values.

In one or more embodiments, the hybrid calibration process includes the sub-steps shown in FIG. 1A. For example, for each sub time period (e.g., day) of a predetermined time period (e.g., week) of the available training data, train the time-insensitive and time-sensitive parameters together, as shown in step 108. Consider that in a non-limiting example, the ADE models a physical system and includes time-insensitive parameters (alpha) and time-sensitive parameters (beta). Each of the steps 108, 110, 111 trains using least squares to obtain the sought-after parameters. In step 108, train the two sets of parameters together to determine alphas and betas. In step 110, fix the time-sensitive parameters (use betas from step 108) and obtain an updated set of time-insensitive parameters (better values for alphas). In step 111, fix the time-insensitive parameters (use alphas from step 110) and obtain an updated set of time-sensitive parameters (better values for betas). Stop iterating when there is not much change in alpha and beta, as per decision block 112.

Thus, additional steps include, as per step 110, based on the training of the time-insensitive and time-sensitive parameters together, training the time-insensitive parameters with the predetermined time period of the available training data, with the time sensitive parameters fixed, to obtain updated time-insensitive parameters; and, as per step 111, using the updated time-insensitive parameters to train an updated set of time-sensitive parameters for each of the sub time periods.

Based on the description of decision block 112, it will be appreciated that in one or more embodiments, a further step includes repeating the steps of training the time-insensitive parameters with the predetermined time period of the available training data (step 110) and using the updated time-insensitive parameters to train the updated set of time-sensitive parameters for each of the sub time periods (step 111), until convergence is achieved.

Referring now to FIG. 1B, one or more embodiments use the logical flow therein to carry out each of steps 108, 110, 111. Thus, in one or more embodiments, the step 108 of training the time-insensitive and time-sensitive parameters together for each sub time period of the predetermined time period of the available training data includes, as at 114, making an initial estimate of the time-insensitive and time-sensitive parameters (e.g., alpha and beta, respectively); and, as at 116, using a genetic algorithm (GA) to determine a parameter fitting of the time-insensitive and time-sensitive parameters for the each sub time period of the predetermined time period of the available training data. A further step (refer to decision block 118) includes repeating the steps 114, 116 of making the initial estimate of the time-insensitive and time-sensitive parameters and using the genetic algorithm for the each sub time period until convergence is achieved.

Furthermore, in one or more embodiments, the step 110 of training the time-insensitive parameters to obtain updated time-insensitive parameters includes, as at 114, making an initial estimate of the time insensitive parameters (e.g., hold beta fixed to obtain the "best" alpha); and, as at 116, using the genetic algorithm to determine a parameter fitting of the time-insensitive parameters for the predetermined time period of the available training data. Note that the same genetic algorithm referred to above is used, albeit with different inputs and outputs. A further step (refer to decision block 118) includes repeating the steps of making the initial estimate of the time insensitive parameters and using the genetic algorithm to determine the parameter fitting of the time-insensitive parameters until convergence is achieved.

Even further, in one or more embodiments, the step 111 of using the updated time-insensitive parameters to train the updated set of time-sensitive parameters for each of the sub time periods includes, as at 114, making an initial estimate of the time sensitive parameters (e.g., with alpha held fixed, obtain the "best" beta); and, as at 116, using the genetic algorithm to determine a parameter fitting for the time sensitive parameters for the each sub time period of the predetermined time period of the available training data. Note that, again, the same genetic algorithm referred to above is used, albeit with different inputs and outputs. A further step (refer to decision block 118) includes repeating the steps of making the initial estimate of the time sensitive parameters and using the genetic algorithm for the time sensitive parameters until convergence is achieved.

It should be noted that decision block 118 is not the same decision block as decision block 112. Block 118 is for iteration within steps 108, 110, 111; block 112 iterates on a larger scale over both of steps 110 and 111.

One or more embodiments of the invention, or elements thereof, can be implemented, at least in part, in the form of an apparatus including a memory and at least one processor that is coupled to the memory and operative to perform exemplary method steps.

Figure 13:
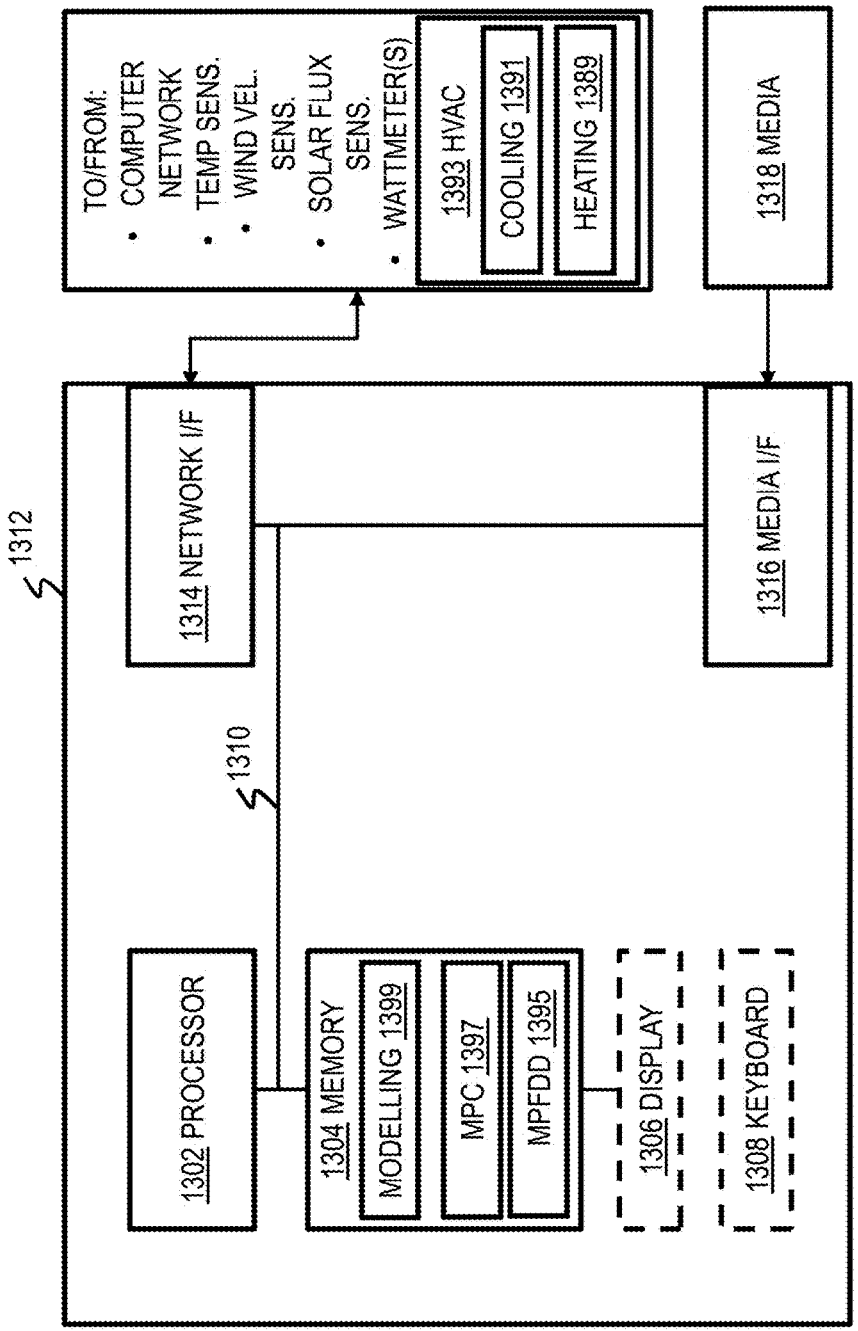
FIG. 13 depicts a system, according to an aspect of the invention.

One or more embodiments can make use of software running on a general purpose computer or workstation (e.g., to provide a Model Predictive Controller (MPC) or a Model Predictive FDD (Fault Detection and Diagnosis) tool and/or a separate (or the same) computer that generates a model for use by such a controller or tool). With reference to FIG. 13, such an implementation might employ, for example, a processor 1302, a memory 1304, and an input/output interface formed, for example, by a display 1306 and a keyboard 1308. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 1302, memory 1304, and input/output interface such as display 1306 and keyboard 1308 can be interconnected, for example, via bus 1310 as part of a data processing unit 1312. Suitable interconnections, for example via bus 1310, can also be provided to a network interface 1314, such as a network card, which can be provided to interface with a computer network, and to a media interface 1316, such as a diskette or CD-ROM drive, which can be provided to interface with media 1318.

Interface 1314 is generally representative of a variety of techniques for communicating with and controlling the various elements discussed herein. For example, processor 1302 can communicate with one or more temperature sensors, one or more wind velocity sensors, one or more solar flux sensors, and one or more watt meters, via the computer network or otherwise (e.g., an analog-to-digital converter or the like). Processor 1302 can also communicate with a building HVAC system 1393 including cooling sub-system 1391 and heating sub-system 1389, again, via the computer network or otherwise. The heating sub-system can include a boiler, furnace, or heat pump (e.g., electronic) or the like to heat water, steam, or air in a central location such as a mechanical room in a large building. The heat can be transferred by convection, conduction, or radiation. The cooling sub-system can include a mechanical refrigeration cycle, evaporative cooling, chiller, or the like.

The watt meters may measure, for example, electrical power consumption by HVAC or other components. The temperature sensors measure pertinent temperatures as described herein. The wind velocity sensor(s) may be used to predict external convection coefficient, for example. The solar flux sensors may be used to measure solar flux for purposes of estimating solar heat gain. Some systems omit one or more sensors and obtain the data from other sources (e.g., wind velocity could be obtained from a weather station; solar flux could be estimated from tabulated data and data on overcast level obtained from a weather station).

Modelling module 1399 may be stored in persistent memory and loaded into volatile memory to configure processor 1302 to carry out the techniques described herein; e.g., training, parameter estimation, vector auto-regression, and so on. MPC module 1397 may be stored in persistent memory and loaded into volatile memory to configure processor 1302 to implement a Model Predictive Controller (MPC) to control HVAC system 1393. MPFDD module 1395 may be stored in persistent memory and loaded into volatile memory to configure processor 1302 to implement a Model Predictive FDD (Fault Detection and Diagnosis) tool to troubleshoot HVAC system 1393.

In the non-limiting example of FIG. 13, the modelling module 1399, MPC module 1397, and MPFDD module 1395 are all shown on the same machine 1312. However, each could run on a separate machine, or the modelling module 1399 could run on one machine and the MPC module 1397 and MPFDD module 1395 could run on another machine. Regardless of whether they run on the same or different machines, each module will have access to the external data and/or systems that it requires to carry out its respective function; e.g., the sensor(s), watt meter(s), or HVAC system.

MPC module can carry out a number of different controls of HVAC system 1393 based on inputs from modelling module 1399; e.g., increasing (if cooling) or decreasing (if heating) the set-point temperature during a pertinent period to avoid excess energy consumption, while still maintaining occupant thermal comfort; cycling a compressor on or off; changing fan or pump speed; cycling a furnace or boiler on or off, etc.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1302 coupled directly or indirectly to memory elements 1304 through a system bus 1310. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 1308, displays 1306, pointing devices, and the like) can be coupled to the system either directly (such as via bus 1310) or through intervening I/O controllers (omitted for clarity).

Network adapters such as network interface 1314 may also be coupled to the system to enable the data processing system to become coupled to other data processing systems or remote printers or storage devices through intervening private or public networks. Modems, cable modem and Ethernet cards are just a few of the currently available types of network adapters. In one or more embodiments, network interface 1314 collects data and also sends control signals.

Computer-human interfaces can be provided using, for example, a suitable graphical user interface (GUI) wherein a server serves html out to a browser on a user's client machine. Interfaces between software and/or hardware elements can employ hard-wired connections, networks, database programs to retrieve parameters from persistent storage, application programming interfaces (APIs), shared data structures, and the like.

As used herein, including the claims, a "server" includes a physical data processing system (for example, system 1312 as shown in FIG. 13) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the elements depicted in the block diagrams or other figures and/or described herein (e.g., MPC module 1397, MPFDD module 1395, modelling module 1399 optionally with sub-modules to handle training, parameter estimation, vector auto-regression, and so on). The method steps can then be carried out using the distinct software modules and/or sub-modules of the system, as described above, executing on one or more hardware processors 1302. Further, a computer program product can include a computer-readable storage medium with code adapted to be implemented to carry out one or more method steps described herein, including the provision of the system with the distinct software modules.

Exemplary System and Article of Manufacture Details

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
   a memory;
   at least one processor, coupled to said memory; and
   a non-transitory computer readable medium comprising computer executable instructions which when loaded into said memory configure said at least one processor to:
      access an algebra and differential equations model of a physical system based on available training data and physical system characteristics;
      carry out a hybrid calibration process to iteratively calibrate both time-insensitive and time-sensitive parameters of said algebra and differential equations model so as to obtain parameter vectors; and
      apply vector auto-regression to said parameter vectors to predict values of said parameters for a future time period,
   wherein said model of said physical system comprises a heat transfer model of a building, wherein said computer executable instructions further configure said at least one processor to:
      supply a predictive model, based on said predicted values of said parameters for said future time period, to a building heating, ventilating, and air conditioning system model predictive controller; and
      control said building heating, ventilating, and air conditioning system by said model predictive controller to adjust a temperature of a building in accordance with said predictive model,
   wherein said computer executable instructions configure said at least one processor to carry out said hybrid calibration process by:
      for each sub time period of a predetermined time period of said available training data, training said time-insensitive and time-sensitive parameters together;
      based on said training of said time-insensitive and time-sensitive parameters together, training said time-insensitive parameters with said predetermined time period of said available training data, with said time sensitive parameters fixed, to obtain updated time-insensitive parameters;
      using said updated time-insensitive parameters to train an updated set of time-sensitive parameters for each of said sub time periods; and
      repeating said training of said time-insensitive parameters with said predetermined time period of said available training data and said using of said updated time-insensitive parameters to train said updated set of time-sensitive parameters for each of said sub time periods, until convergence is achieved, wherein:
   said training said time-insensitive and time-sensitive parameters together for each sub time period of said predetermined time period of said available training data comprises:
      making an initial estimate of said time-insensitive and time-sensitive parameters;
      using a genetic algorithm to determine a parameter fitting of said time-insensitive and time-sensitive parameters for said each sub time period of said predetermined time period of said available training data; and
      repeating said steps of making said initial estimate of said time-insensitive and time-sensitive parameters and using said genetic algorithm for said each sub time period until convergence is achieved;
   said training said time-insensitive parameters to obtain updated time-insensitive parameters comprises:
      making an initial estimate of said time insensitive parameters;
      using said genetic algorithm to determine a parameter fitting of said time-insensitive parameters for said predetermined time period of said available training data; and
      repeating said steps of making said initial estimate of said time insensitive parameters and using said genetic algorithm to determine said parameter fitting of said time-insensitive parameters until convergence is achieved; and
   said using of said updated time-insensitive parameters to train said updated set of time-sensitive parameters for each of said sub time periods comprises:
      making an initial estimate of said time sensitive parameters;
      using said genetic algorithm to determine a parameter fitting for said time sensitive parameters for said each sub time period of said predetermined time period of said available training data; and
      repeating said steps of making said initial estimate of said time sensitive parameters and using said genetic algorithm for said time sensitive parameters until convergence is achieved.

2. The apparatus of claim 1, wherein:

said computer executable instructions comprise a hybrid calibration sub-module of a modeling module and a vector auto-regression sub-module of said modeling module;

said hybrid calibration process is implemented by said hybrid calibration sub-module of said modeling module, executing on said at least one hardware processor; and said applying of said vector auto-regression to said parameter vectors is implemented by said vector auto-regression sub-module of said modeling module, executing on said at least one hardware processor.

3. A non-transitory computer readable medium comprising computer executable instructions which when executed by a computer cause said computer to perform the method of:

constructing an algebra and differential equations model of a physical system based on available training data and physical system characteristics;

carrying out a hybrid calibration process to iteratively calibrate both time-insensitive and time-sensitive parameters of said algebra and differential equations model so as to obtain parameter vectors; and applying vector auto-regression to said parameter vectors to predict values of said parameters for a future time period, wherein said model of said physical system comprises a heat transfer model of a building, wherein said computer executable instructions further configure said computer to:

control a heating sub-system and/or a cooling sub-system to heat and/or cool a building, by implementing a building heating, ventilating, and air conditioning system controller in accordance with a predictive model based on said predicted values of said parameters for said future time period, wherein said hybrid calibration process includes:

for each sub time period of a predetermined time period of said available training data, training said time-insensitive and time-sensitive parameters together;

based on said training of said time-insensitive and time-sensitive parameters together, training said time-insensitive parameters with said predetermined time period of said available training data, with said time sensitive parameters fixed, to obtain updated time-insensitive parameters;

using said updated time-insensitive parameters to train an updated set of time-sensitive parameters for each of said sub time periods; and repeating said training of said time-insensitive parameters with said predetermined time period of said available training data and said using of said updated time-insensitive parameters to train said updated set of time-sensitive parameters for each of said sub time periods, until convergence is achieved, wherein:

said training said time-insensitive and time-sensitive parameters together for each sub time period of said predetermined time period of said available training data comprises:

making an initial estimate of said time-insensitive and time-sensitive parameters;

using a genetic algorithm to determine a parameter fitting of said time-insensitive and time-sensitive parameters for said each sub time period of said predetermined time period of said available training data; and repeating said steps of making said initial estimate of said time-insensitive and time-sensitive parameters and using said genetic algorithm for said each sub time period until convergence is achieved;

said training said time-insensitive parameters to obtain updated time-insensitive parameters comprises:

making an initial estimate of said time insensitive parameters;

using said genetic algorithm to determine a parameter fitting of said time-insensitive parameters for said predetermined time period of said available training data; and repeating said steps of making said initial estimate of said time insensitive parameters and using said genetic algorithm to determine said parameter fitting of said time-insensitive parameters until convergence is achieved; and said using of said updated time-insensitive parameters to train said updated set of time-sensitive parameters for each of said sub time periods comprises:

making an initial estimate of said time sensitive parameters;

using said genetic algorithm to determine a parameter fitting for said time sensitive parameters for said each sub time period of said predetermined time period of said available training data; and repeating said steps of making said initial estimate of said time sensitive parameters and using said genetic algorithm for said time sensitive parameters until convergence is achieved.

* * * * *